US 6,667,365 B2

(12) United States Patent
Chung et al.

(10) Patent No.: US 6,667,365 B2
(45) Date of Patent: Dec. 23, 2003

(54) METHOD FOR MANUFACTURING POLYMER NANO PARTICLE

(75) Inventors: Myung Ae Chung, Daejon-shi (KR); Sang Don Jung, Daejon-shi (KR)

(73) Assignee: Electronics and Telecommunications Research Institute, Daejon (KR)

( * ) Notice: Subject to any disclaimer, the term of this patent is extended or adjusted under 35 U.S.C. 154(b) by 0 days.

(21) Appl. No.: 10/185,651

(22) Filed: Jun. 27, 2002

(65) Prior Publication Data

US 2003/0156470 A1 Aug. 21, 2003

(30) Foreign Application Priority Data

Feb. 19, 2002 (KR) .......................................... 2002-8662

(51) Int. Cl.$^7$ ............................................. C08L 31/00
(52) U.S. Cl. ...................... 524/832; 524/801; 524/808; 526/207; 526/210; 526/328
(58) Field of Search ................ 524/801, 808, 524/832; 526/207, 210, 328

(56) References Cited

U.S. PATENT DOCUMENTS

| 4,864,537 A | | 9/1989 | Michl ei al. |
| 5,916,487 A | * | 6/1999 | Weidlich et al. ............ 252/586 |
| 5,936,878 A | | 8/1999 | Arsenov et al. |

FOREIGN PATENT DOCUMENTS

| DE | 199 18486 A1 | * | 10/2000 |
| EP | 0 240 424 | * | 10/1987 |
| JP | 1993-349417 | | 8/1995 |

OTHER PUBLICATIONS

Recording by microexplosion and two-photon reading of three-dimensional optical memory in polymethylmethacrylate films by K. Yamasaki et al.

* cited by examiner

Primary Examiner—Helen L. Pezzuto
(74) Attorney, Agent, or Firm—Blakely, Sokoloff, Taylor & Zafman

(57) ABSTRACT

The present invention relates to a method of manufacturing polymer nano particle having two-photon absorption compound at its central portion. The method of manufacturing polymer nano particle comprises the steps of dispersing a monomer for forming polymer nano particle and two-photon absorption compound into a solvent; supplying a given gas while stirring the solvent in which the monomer and the two-photon absorption compound are dispersed at a given temperature, in order to remove the dissolved oxygen contained in the solvent; supplying polymerization initiators into the solvent while stirring the solvent in which the monomer and the two-photon absorption compound are dispersed at a given temperature; and polymerizing the monomer for a given period of time while stirring the solvent in which the monomer and the two-photon absorption compound are dispersed at a given temperature.

15 Claims, 2 Drawing Sheets

METHOD FOR MANUFACTURING POLYMER NANO PARTICLE

BACKGROUND OF THE INVENTION

1. Field of the Invention

The invention relates generally to a method of manufacturing polymer nano particle, and more particularly to, a method of manufacturing polymer nano particle containing two-photon absorption compound at its central portion.

2. Description of the Prior Art

Two-photon adsorption is defined to be a switching from a ground state to an excitation state due to consecutive absorption of two consecutive photons (where the sum of the two consecutive photo optical energy is same or greater to/than the energy gap of a non-linear optical material) having the energy smaller than the energy gap of the non-linear optical material.

The degree of two-photon absorption is proportional to the product of two-beam intensity. Therefore, absorption occurs only at a portion where the beam is focused. As a result, it is possible to define photochemical phenomenon due to two-photon absorption excitation in three-dimension. If this two-photon absorption is applied to application fields such as a three-dimensional optical memory, an up-conversion lasing, an optical power limiting, and the like, a common method of manufacturing an actual two-photon absorption medium includes optically distributing transparent polymer, etc. into a molecular unit. In this method, however, a gathered substance in which two-photon absorption compounds are physically coupled is formed due to a thermal effect and the difference in the polarity between two-photon absorption compound and optically transparent polymer. If the size of the two-photon absorption compound is greater than the wavelength of a visible ray region by $\frac{1}{10}$, the gathered substance acts to scatter the beam, so that the beam does not penetrate into the medium in space. Further, in the application fields such as two-photon absorption excitation luminescence or laser oscillation, or the like, there is a problem that the luminescence and laser oscillation efficiency are abruptly reduced as the size of the two-photon absorption compound becomes larger. In order to preventing reducing the scattering and luminescence efficiency, it is required that the amount of dispersion of the two-photon absorption compound be reduced. However, this results in decreased two-photon absorption and the efficiency of a phenomenon accordingly.

SUMMARY OF THE INVENTION

The present invention is contrived to solve the above problems and an object of the present invention is to provide a method of manufacturing polymer nano particle containing photon absorption compound enough to cause an optical scattering at the central portion of the polymer nano particle and thus capable of controlling two-photon absorption wavelength.

In order to accomplish the above object, a method of manufacturing polymer nano particle according to the present invention, is characterized in that it comprises the steps of dispersing a monomer for forming polymer nano particle and two-photon absorption compound into a solvent; supplying a given gas while stirring the solvent in which the monomer and the two-photon absorption compound are dispersed at a given temperature, in order to remove the dissolved oxygen contained in the solvent; supplying polymerization initiators into the solvent while stirring the solvent in which the monomer and the two-photon absorption compound are dispersed at a given temperature; and polymerizing the monomer for a given period of time while stirring the solvent in which the monomer and the two-photon absorption compound are dispersed at a given temperature.

Further, in order to accomplish the above object, a method of manufacturing polymer nano particle according to the present invention, is characterized in that it comprises the steps of dispersing a monomer for forming polymer nano particle, two-photon absorption compound and surfactant into a solvent; supplying a given gas while stirring the solvent in which the monomer, the two-photon absorption compound and surfactant are dispersed at a given temperature, in order to remove the dissolved oxygen contained in the solvent; supplying polymerization initiators into the solvent while stirring the solvent in which the monomer, the two-photon absorption compound and surfactant are dispersed at a given temperature; polymerizing the monomer for a given period of time while stirring the solvent in which the monomer, the two-photon absorption compound and surfactant are dispersed at a given temperature, thus forming polymer nano particle; and removing the surfactant adhered to the surface of polymer nano particle using a given solvent.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Polymerization can be mainly classified into emulsion polymerization using a surfactant and non-emulsion polymerization not using a surfactant. In case of using the surfactant, in general, a nano particle of less 100 nm can be obtained and the reactive velocity is rapid compared to non-emulsion polymerization.

A method of manufacturing polymer nano particle according to a first embodiment of the present invention using a surfactant will be below described. A method of manufacturing polymer nano particle according to a second embodiment of the present invention using a non-emulsion polymerization will be then described.

<Embodiment 1>

Figure 1:
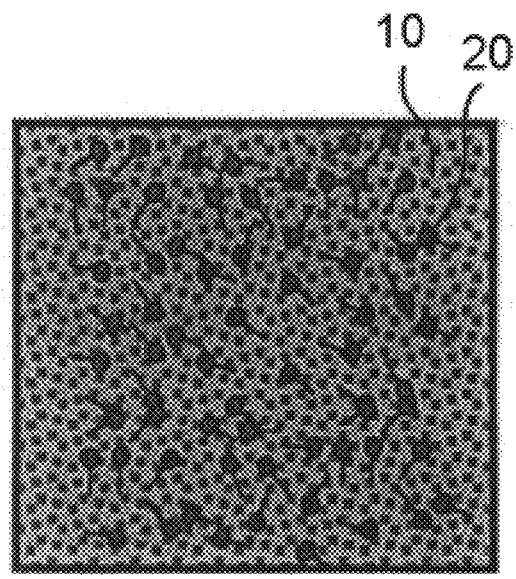
FIG. 1 through FIG. 4 are drawing for describing a method of manufacturing polymer nano particle according to preferred embodiment of the present invention.

Referring now to FIG. 1 a surfactant 20, a monomer for forming nano particle such optically transparent polymer (i.e., polymethyl methacrylate (PMMA), polystyrene, polystyrene sulfonate, etc.) and two-photon absorption compound are dispersed into a solvent. They are stirred at a given rate (rpm) using a stirring machine while maintaining a given temperature (for example, 40~90° C.). In this process, micelle 10 containing monomer and two-photon absorption compound therein is formed. Stilbene families are used as two-photon absorption compound. The monomer may include methyl methacrylate, styrene, styrene sulfonate, vinyl acetate, methyl styrene, acrylic acid, butyl methacrylate, ethyl methacrylate, 2-ethylhexyl acrylate, N-vinylcarprolactam, and the like. The monomer includes more than two monomers having different polarities. The relative ratio of the monomers is controlled to adjust the polarity. The solvent may include water or alcohol. The surfactant 20 may include sodium dodecyl sulfate (SDS) being anion surfactant, cetyltrimethylammonium bromide (CTAB) being cation surfactant, cetyltrimethylammonium chloride (CTAC), stearyltrimethylammonium chloride (STAC), dodecyl trimethylammonium bromide (DTAB), sodium 1,2-bis (2-ethylhexyl) sulfosuccinate (aerosol-OT), or the like.

In the emulsion polymerization using thus surfactant 20, the concentration of the surfactant 20 greatly affects the size and property of polymer nano particle. Generally, as the concentration of the surfactant 20 becomes higher, a smaller particle can be obtained. The size of micelle 10 is determined by a relative composition ratio of the type of the surfactant 20 and the solvent.

Figure 2:
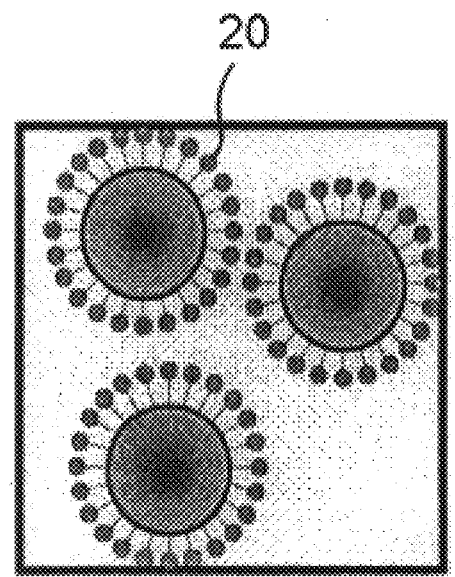
Figure 3:
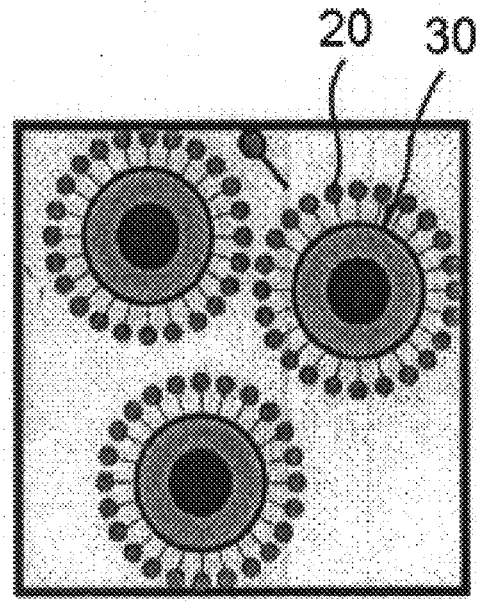

Referring now to FIGS. 2 and 3, inert gases such as nitrogen ($N_2$) or argon (Ar) are supplied to remove dissolved oxygen contained in the water and optical or thermal polymerization initiators are injected, so that the monomer is polymerized for a given time (for example, within 24 hours). The polymerization initiators may include potassium persulfate (KPS), ammonium persulfate (APS), 2,2'-Azobis (2-methylpropionitrile), and the like. If the solvent is water, potassium persulfate (KPS) and ammonium persulfate (APS) are mainly used. On the other hand, if the solvent is alcohol, 2,2'-Azobis (2-methylpropionitrile) is usually used. At this time, persulfate serves to initiate and stabilize the reaction by being adhered to the surface of the bubble of a monomer.

Figure 4:
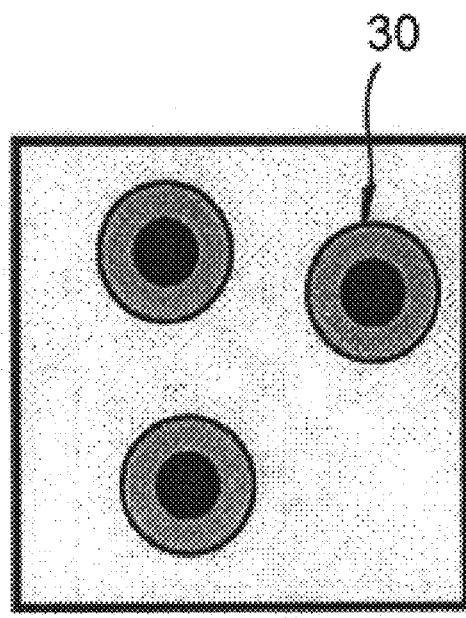

Referring now to FIG. 4, the surfactant 20 adhered to the surface of nano particle is removed using solvents (for example, methanol, ethanol, etc.), so that polymer nano particle 30 containing two-photon absorption compound collector having the nano size can be finally obtained. The two-photon absorption compound injected into the polymer nano particle is located at the center of the polymer nano particle 30 of a nano size. An optically transparent polymer usually forms a shell. Polymer forming the shell, is geometrically isolates the two-photon absorption compound collectors to prevent contact between the two-photon absorption compound collectors contained in different nano particles. Thus, the polymer serves to define the size of the two-photon absorption compound collector.

Polymer nano particle 30 in which the two-photon absorption compound is contained, has an outstanding dispersion property compared to a case that two-photon absorption compound itself is dispersed into liquid or other polymer medium. Meanwhile, since the size of two-photon absorption compound collector can be adjusted by controlling the amount of the two-photon absorption compound injected into polymer nano particle 30, the two-photon absorption wavelength can be controlled. The size of two-photon absorption compound collector contained in polymer nano particle 30 can be controlled by the amount of injected two-photon absorption compound. The two-photon absorption wavelength can be thus controlled.

As formation of two-photon absorption compound collector is affected by the difference in the polarity of two-photon absorption compound and the monomer for forming nano particle, it is necessary to control the polarity for efficient isolation. In the present invention, more than two monomers having different polarities are used and the relative ratio of the monomers is controlled to adjust the polarity.

<Embodiment 2>

A method of manufacturing polymer nano particle using non-emulsion polymerization will be below described.

In order to manufacture polymer nano particle, a monomer for forming an optically transparent polymer nano particle and two-photon absorption compound are dispersed into a solvent. They are stirred at a given rate (rpm) using a stirring machine whole maintaining a given temperature (for example, 40~90° C.). Nitrogen ($N_2$) or inert gas are supplied to remove dissolved oxygen contained in the water and optical or thermal polymerization initiators are injected. Due to this, the monomer is polymerized for a given time (for example, within 24 hours) to form polymer nano particle containing a two-photon absorption compound collector of a nano size. The two-photon absorption compound injected into polymer nano particle is located at the central portion of the polymer nano particle. An optically transparent polymer usually forms a shell. Polymer for forming the shell geometrically isolates the two-photon absorption compound collector to prevent contact between the two-photon absorption compound collectors contained different nano particles. Thus, the polymer serves to define the size of the two-photon absorption compound collector.

<Experiment Example 1>

Styrene of 50 ml as a monomer and a two-photon absorption compound of stilbene families are dispersed into distilled water of 750 ml as a solvent in the flask. Nitrogen ($N_2$) is injected while stirring the solvent included styrene and two-photon absorption compound at the rate of 350 rpm using a stirring machine at a given temperature, so that oxygen in the distilled water is sufficiently removed. Potassium persulfate (KPS) of 0.07 g as initiators is inserted and is then reacted for 24 hours to form polystyrene nano particle.

Below Table 1 represents variations in the size of polystyrene nano particle depending on the reaction temperature.

TABLE 1

| Temperature (° C.) | 65 | 75 | 85 | 95 |
|---|---|---|---|---|
| Size (nm) | 500 | 380 | 300 | 250 |

From Table 1, it can be seen that as the reaction temperature becomes higher, the size of polystyrene nano particle becomes smaller.

Below Table 2 represents variations in the size of polystyrene nano particle depending on the intensity and ions of temperature.

TABLE 2

|  | $9 \times 10^{-3}$ | $10^{-2}$ | $3 \times 10^{-2}$ | $6 \times 10^{-2}$ | $9 \times 10^{-2}$ |
|---|---|---|---|---|---|
| 60° C. | 633 nm | 650 nm | 825 nm | 995 nm | 1100 nm |
| 70° C. | 500 nm | 513 nm | 666 nm | 786 nm | 865 nm |
| 80° C. | 400 nm | 411 nm | 533 nm | 629 nm | 693 nm |
| 90° C. | 324 nm | 333 nm | 432 nm | 510 nm | 561 nm |
| 100° C. | 267 nm | 273 nm | 354 nm | 418 nm | 460 nm |

From Table 2, it can be seen that as the intensity of ions becomes smaller, the size of the polystyrene nano particle become smaller.

<Experiment Example 2>

Methyl methacrylate as a monomer, Cetyltrimethylammonium chloride (CTAB) as surfactant and two-photon absorption compound of stilbene families are dispersed into distilled water of 750 ml being a solvent in the flask. Nitrogen ($N_2$) is injected by stirring them at the rate of 350 rpm using a stirring machine while a given temperature is maintained, so as to sufficiently remove oxygen in the distilled water for about one hour. Then, potassium persulfate (KPS) of 0.07g as initiators is inserted and is reacted for 24 hours, thus forming polymethyl methacrylate (PMMA) nano particle.

Below Table 3 represents variations in the size of polymethyl methacrylate (PMMA) nano particle depending on the amount of surfactant.

TABLE 3

| Weight Ratio (surfactant/methylmethacrylate) | Size of nano particle |
| --- | --- |
| 0.1 | 51 nm |
| 0.5 | 45 nm |
| 1 | 38 nm |
| 2 | 38 nm |
| 3 | 38 nm |

From Table 3, it can be seen that as the concentration of the surfactant becomes smaller, the size of polymethyl methacrylate (PMMA) nano particle becomes smaller.

As can be seen from the Experiment Examples 1 and 2, polymer nano particle are different depending on the reaction temperature, the concentration of a monomer and a surfactant, and the intensity of ions, and the like. It can be seen that polymer nano particle of various sizes can be obtained by combining them.

As mentioned above, according to the present invention, polymer nano particle in which a two-photon absorption compound is located at the central portion of polymer particle of a nano size and in which an optically transparent polymer is located at the shell can be manufactured. Polymer forming the shell serves to geometrically isolate the two-photon absorption compound and to prevent contact between two-photon absorption compounds contained in different nano particles. In other words, polymer nano particle contained in the two-photon absorption compound has an outstanding dispersion property compared to a case that two-photon absorption compound itself is dispersed into liquid or other polymer medium. Further, according to the present invention, the size of a two-photon absorption compound collector and the wavelength of two-photon absorption can be controlled by adjusting the amount of the two-photon absorption compound injected into polymer nano particle.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing polymer nano particle, comprising the steps of:
   dispersing a monomer for forming polymer nano particle and two-photon absorption compound into a solvent;
   supplying a given gas while stirring the solvent in which the monomer and the two-photon absorption compound are dispersed at a given temperature, in order to remove the dissolved oxygen contained in the solvent;
   supplying polymerization initiators into the solvent while stirring the solvent in which the monomer and the two-photon absorption compound are dispersed at a given temperature; and
   polymerizing the monomer for a given period of time while stirring the solvent in which the monomer and the two-photon absorption compound are dispersed at a given temperature.

2. The method as claimed in claim 1, wherein said monomer includes more than two monomers having different polarities and the relative ratio of the monomers are controlled to adjust the polarity.

3. The method as claimed in claim 2, wherein said monomer includes methyl methacrylate, styrene, styrene sulfonate, vinyl acetate, methyl styrene, acrylic acid, butyl methacrylate, ethyl methacrylate, 2-ethylhexyl acrylate and N-vinylcarprolactam.

4. The method as claimed in claim 1, wherein said two-photon absorption compound includes styrene compound.

5. The method as claimed in claim 1, wherein said polymerization initiators includes potassium persulfate, ammonium persulfate and 2,2'-Azobis (2-methylpropionitrile).

6. The method as claimed in claim 1, wherein said solvent in which the monomer, the two-photon absorption compound are dispersed includes water or alcohol.

7. A method of manufacturing polymer nano particle, comprising the steps of:
   dispersing a monomer for forming polymer nano particle, two-photon absorption compound and surfactant into a solvent;
   supplying a given gas while stirring the solvent in which the monomer, the two-photon absorption compound and surfactant are dispersed at a given temperature, in order to remove the dissolved oxygen contained in the solvent;
   supplying polymerization initiators into the solvent while stirring the solvent in which the monomer, the two-photon absorption compound and surfactant are dispersed at a given temperature;
   polymerizing the monomer for a given period of time while stirring the solvent in which the monomer, the two-photon absorption compound and surfactant are dispersed at a given temperature, thus forming polymer nano particle; and
   removing the surfactant adhered to the surface of polymer nano particle using a given solvent.

8. The method as claimed in claim 7, wherein a relative composition ratio of the surfactant and the solvent is controlled to adjust the size of the polymer nano particle.

9. The method as claimed in claim 7, wherein said surfactant includes sodium dodecyl sulfate (SDS), cetyltrimethylammonium bromide (CTAB), cetyltrimethylammonium chloride (CTAC), stearyltrimethylammonium chloride (STAC), dodecyl trimethylammonium bromide (DTAB) and sodium 1,2-bis (2-ethylhexyl) sulfosuccinate (aerosol-OT).

10. The method as claimed in claim 7, wherein said solvent for removing the surfactant includes methanol or ethanol.

11. The method as claimed in claim 7, wherein said monomer includes more than two monomers having different polarities and the relative ratio of the monomers are controlled to adjust the polarity.

12. The method as claimed in claim 11, wherein said monomer includes methyl methacrylate, styrene, styrene sulfonate, vinyl acetate, methyl styrene, acrylic acid, butyl methacrylate, ethyl methacrylate, 2-ethylhexyl acrylate and N-vinylcarprolactam.

13. The method as claimed in claim 7, wherein said two-photon absorption compound includes styrene compound.

14. The method as claimed in claim 7, wherein said polymerization initiators includes potassium persulfate, ammonium persulfate and 2,2'-Azobis (2-methylpropionitrile).

15. The method as claimed in claim 7, wherein said solvent in which the monomer, the two-photon absorption compound are dispersed includes water or alcohol.

* * * * *